United States Patent [19]
Lee et al.

[11] Patent Number: 5,966,337
[45] Date of Patent: Oct. 12, 1999

[54] METHOD FOR OVERDRIVING BIT LINE SENSE AMPLIFIER

[75] Inventors: Jae-Goo Lee, Kyungki-Do; Young-Hyun Jun, Seoul, both of Rep. of Korea

[73] Assignee: LG Semicon Co., Ltd., Cheongju, Rep. of Korea

[21] Appl. No.: 08/958,932

[22] Filed: Oct. 28, 1997

[30] Foreign Application Priority Data

May 31, 1997 [KR] Rep. of Korea ............. 97-22564

[51] Int. Cl.$^6$ ..................................... G11C 7/00
[52] U.S. Cl. ........................... 365/203; 365/207
[58] Field of Search ..................... 365/203, 222, 365/207, 204, 191

[56] References Cited

U.S. PATENT DOCUMENTS

| | | | |
|---|---|---|---|
| 5,404,327 | 4/1995 | Houston | 365/203 |
| 5,561,630 | 10/1996 | Katoh et al. | 365/189.01 |
| 5,708,616 | 1/1998 | Choi | 365/207 |

*Primary Examiner*—A. Zarabian
*Attorney, Agent, or Firm*—Fleshner & Kim

[57] ABSTRACT

A bit line sense amplifier overdriving method includes a step for reaching a bit line data signal to a full swing level by driving the sense amplifiers in accordance with an overdriving voltage in an overdriving pulse interval, when an overdriving pulse signal is generated at points in which the sense amplifiers are enabled and disabled in a data read operation and a data write operation. The method maintains a sufficiently long refresh interval during a refresh operation.

6 Claims, 3 Drawing Sheets

CONVENTIONAL ART  WL

CONVENTIONAL ART  SAEN

CONVENTIONAL ART  ODP

CONVENTIONAL ART  $\frac{BL}{BL}$

OVERDRIVING TIME

CONVENTIONAL ART  WL

CONVENTIONAL ART  SAEN

CONVENTIONAL ART  $\frac{BL}{BL}$

METHOD FOR OVERDRIVING BIT LINE SENSE AMPLIFIER

BACKGROUND OF THE INVENTION

1. Field of the Invention

The present invention relates to a sense amplifier overdriving method, and more particularly to an improved sense amplifier overdriving method for entirely restoring a bit line during a read and write operation, by overdriving a sense amplifier at a disable point as well as at an enable point thereof.

2. Description of the Prior Art

In a conventional sense amplifier, a PMOS transistor is provided with a relatively small current driving capacity compared to an NMOS transistor, but the size thereof is approximately two times larger than that of NMOS transistor.

In recent years, an ever increasing DRAM capacity has significantly decreased a chip size, and a PMOS transistor provided in a sense amplifier has accordingly decreased down to a size similar to that of NMOS transistor. As a result, a data driving characteristic of a PMOS transistor has been deteriorated, for thereby generating an undesired high bit line data signal amplified in a sense amplifier, and there is further employed a sense amplifier overdriving method for overdriving a sensing data at an enable point of the sense amplifier.

With reference to FIG. 1 illustrating a schematic circuit diagram for a general semiconductor memory structure, a pair of sense amplifiers 12, 13 are disposed above and below a memory cell 11, respectively. On corresponding sides of the respective sense amplifiers 12, 13 there are disposed sense amplifier drivers 14–17 for driving the sense amplifiers in accordance with an over drive pulse signal ODP.

As shown in FIG. 2, a sense amplifier controller 18 outputs a sense amplifier enable signal SAEN in accordance with an active row address strobe signal RAS, and an over drive pulse generator 19 outputs an over drive pulse signal ODP in accordance with the sense amplifier enable signal SAEN.

As further shown in FIG. 3A, when a word line WL becomes activated in a read operation, a cell charge (data) connected to the word line WL selected from the memory cell 11 comes to be loaded on a corresponding bit line, for thereby forming a potential difference between bit lines BL, /BL.

At this time, when a sense amplifier enable signal SAE is inputted in a state in which the potential difference is less than a minimal potential difference Vmin for reading normal data, the sense amplifier tends to output an invalid data signal.

Therefore, when the sense amplifier controller 18 outputs sense amplifier enable signal SAEN as shown in FIG. 3B in accordance with a row address strobe signal RAS, the over drive pulse generator 19 outputs the over drive pulse signal ODP as shown in FIG. 3C at a point in which the sense amplifier becomes enabled in accordance with the sense amplifier enable signal SAEN.

As a result, in an overdriving interval as shown in FIG. 3D, the sense amplifier drivers 14–17 drive the respective sense amplifiers 12, 13 using an overdriving voltage Vb, for thereby causing the sense amplifier to output a valid data signal.

Also, in a write operation, as shown in FIG. 4A, when a word line WL becomes activated, the sense amplifiers in the sense amplifier controller 18 respectively sense the data signal in accordance with the sense amplifier enable signal SAEN as shown in FIG. 4B, whereby the sensed data signal as shown in FIG. 4C comes to be written in the memory cell 11 through a corresponding bit line.

That is, an overdriving operation of the conventional bit line sense amplifier is carried out only when a sense amplifier becomes enabled in a data read operation.

However, since the conventional overdriving method is applied to read data, the bit line data signal in a data write operation does not reach a full swing level until the word line becomes disabled.

Further, an incomplete data signal that has not reached the full swing level becomes stored in a memory cell capacity, for thereby shortening a refresh interval during a refresh operation.

SUMMARY OF THE INVENTION

Accordingly, it is an object of the present invention to provide a sense amplifier overdriving method for a complete data signal in a cell capacitor by directing a bit line data signal to a full swing level in accordance with an overdriving of a sense amplifier in respective points in which the sense amplifier becomes enabled and disabled.

To achieve the above-described object, a bit line sense amplifier overdriving method according to the present invention characterized in a semiconductor memory device structure in which a pair of sense amplifier units are respectively disposed above and below a memory cell, and a plurality of sense amplifier drivers for driving sense amplifiers in accordance with an overdrive pulse signal are respectively disposed on a corresponding side of each of the sense amplifier units, includes a step for reaching a bit line data signal to a full swing level by driving the sense amplifiers in accordance with an overdriving voltage in an overdriving pulse interval, when an overdriving pulse signal is generated at points in which the sense amplifiers are enabled and disabled in a data read operation and a data write operation.

BRIEF DESCRIPTION OF THE DRAWINGS

The present invention will become more clearly understood with reference to the accompanying drawings given only by way of illustrations and thus not limited to the present invention, wherein.

DETAILED DESCRIPTION OF THE INVENTION

Figure 1:
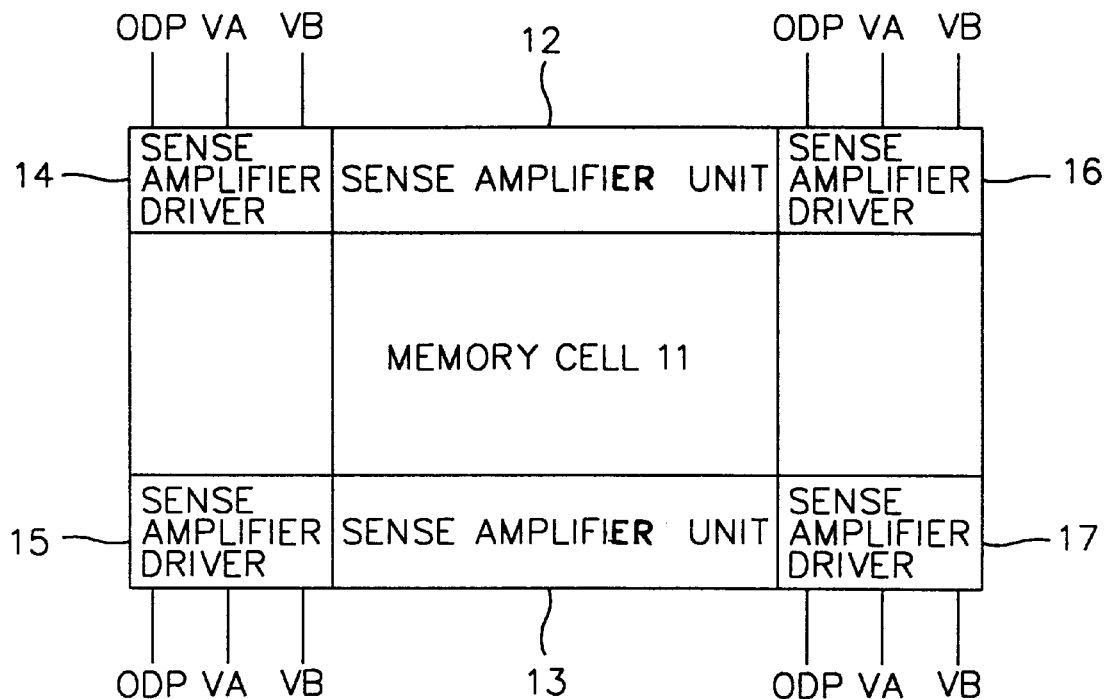
FIG. 1 is a schematic circuit diagram of a general semiconductor memory device structure.
Figure 2:
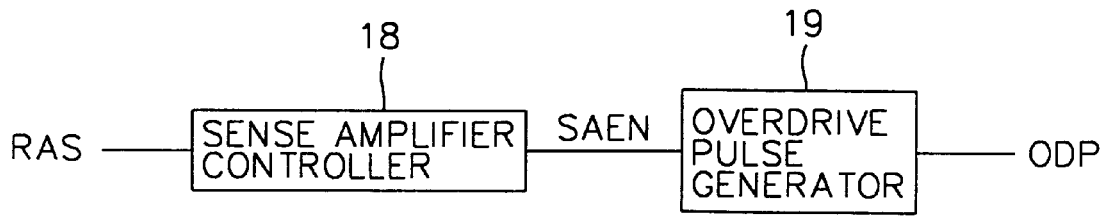
FIG. 2 is a block diagram illustrating a generation path of an overdriving pulse generator.
Figure 3A:
FIGS. 3A through 3D are timing diagrams with regard to input/output wave forms illustrating an overdriving in a data read operation in FIG. 1.
Figure 3B:
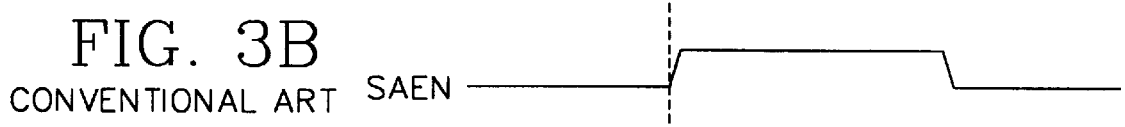
Figure 3C:
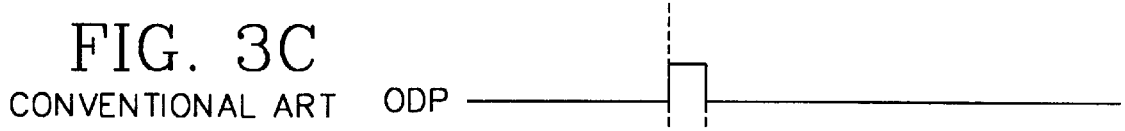
Figure 3D:
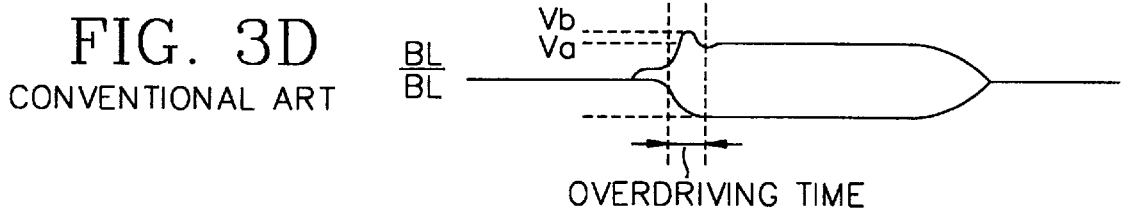
Figure 4A:
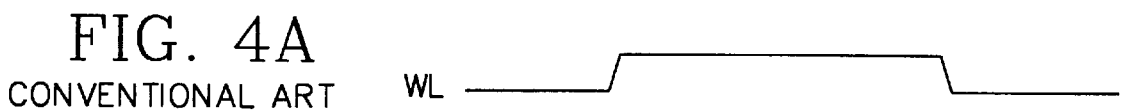
FIGS. 4A through 4C are timing diagrams illustrating input/output wave forms in a data write operation in FIG. 1.
Figure 4B:
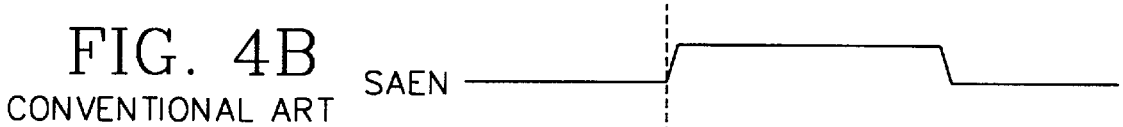
Figure 4C:

The bit line sense amplifier overdriving method according to the present invention is accomplished in a general semiconductor memory device structure as shown in FIG. 1.

Figure 5A:
FIGS. 5A through 5D are timing diagrams illustrating input/output wave forms in a data read operation in FIG. 1 according to the present invention.

First, in a read operation, when a word line WL becomes activated as shown in FIG. 5A, the cell charge (data) connected to the word line selected from the memory cell 11 becomes loaded in a corresponding bit line, and accordingly there is formed a potential difference between bit lines BL, /BL.

Figure 5B:
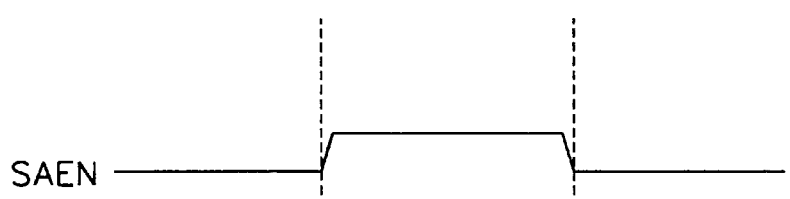
Figure 5C:

An overdriving pulse generator 19 outputs an over drive pulse signal ODP as shown in FIG. 5C in respective points in which the sense amplifier becomes enabled and disabled, in accordance with a sense amplifier enable signal SAEN outputted from the sense amplifier controller 18, as shown in FIG. 5B.

Figure 5D:
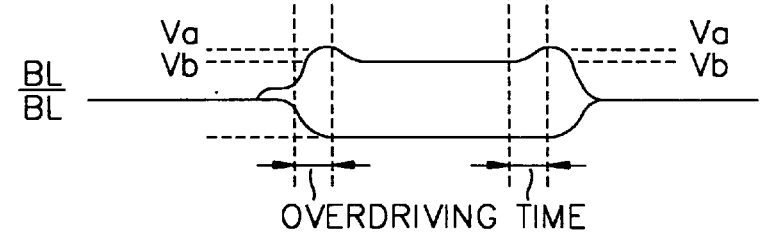

Therefore, in an overdriving interval as shown in FIG. 5D, the sense amplifier drivers 14–17 respectively serve to drive the sense amplifier to an overdriving voltage Vb, whereby respective sense amplifiers in sense amplifier units 12, 13 output a valid data signal.

Figure 6A:
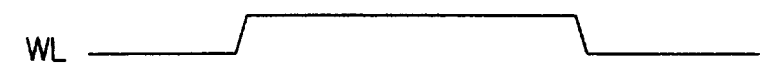
FIGS. 6A through 6D are timing diagrams illustrating input/output wave forms in a data write operation in FIG. 1 according to the present invention.
Figure 6B:
Figure 6C:
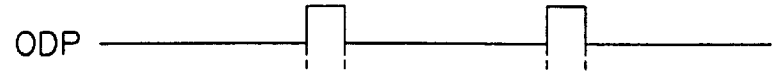

Also, in a read operation, when the word line WL as shown in FIG. 6A becomes activated, the overdrive pulse generator 19 outputs an overdrive pulse signal ODP as shown in FIG. 6C when the sense amplifier becomes enabled and disabled, in accordance with the sense amplifier enable signal SAEN as shown in FIG. 6B.

Figure 6D:
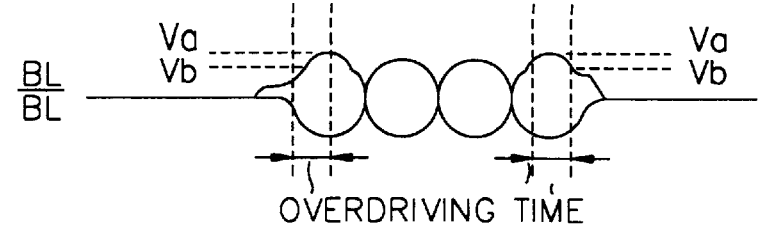

The sense amplifier drivers 14–17 serve to drive the sense amplifier using the overdriving voltage Vb in an overdriving interval, so that when the word line becomes disabled as shown in FIG. 6D, the bit line data comes to reach a full swing level.

As a result, a complete data signal that has reached the full swing level becomes stored in a memory cell capacitor.

As described above, the present invention overdrives the sense amplifier at points in which the sense amplifier becomes enabled and disabled so as to reach a bit line data signal to a full swing level, for thereby outputting a valid data signal in a data write operation.

Further, in a data read operation, a complete data signal becomes stored in a cell capacitor, for thereby maintaining a sufficiently long refresh interval during a refresh operation.

Still further, the present invention enables the bit line data signal to reach a full swing level in a data read and write operation by overdriving the entire sense amplifiers at points in which the respective sense amplifiers become enabled and disabled.

What is claimed is:

1. A method of overdriving a bit line of a memory device during one of reading and writing operations, the method comprising the steps of:

activating a word line of the memory device;

enabling a sense amplifier;

applying a first overdrive signal of a first prescribed pulse width to a sense amplifier driver when the sense amplifier is enabled;

disabling the sense amplifier;

applying a second overdrive signal of a second prescribed pulse width to the sense amplifier driver when the sense amplifier is disabled, wherein the bit line is overdriven to a full swing level during application of the first and second overdrive signals.

2. The method of claim 1, wherein the sense amplifier is enabled and disabled by a sense amplifier controller.

3. The method of claim 1, wherein said first and second overdrive signals are generated by an overdrive pulse signal generator responsive to a sense amplifier enable signal.

4. The method of claim 3, wherein the first overdrive signal is generated when the sense amplifier enable signal transitions from a first transition state to a second transition state, and the second overdrive signal is generated when the sense amplifier enable signal transitions from the second transition state to the first transition state.

5. The method of claim 3, wherein the overdrive pulse signal generator becomes enabled at the start of a transition of the sense amplifier enable signal from a first transition state to a second transition state.

6. The method of claim 5, wherein the overdrive pulse signal generator becomes disabled at a start of the transition of the sense amplifier enable signal from the second transition state to the first transition state.

* * * * *